United States Patent
Wu

(10) Patent No.: US 6,965,146 B1
(45) Date of Patent: Nov. 15, 2005

(54) SELF-ALIGNED PLANAR DMOS TRANSISTOR STRUCTURE AND ITS MANUFACTURING METHODS

(75) Inventor: Ching-Yuan Wu, Hsinchu (TW)

(73) Assignee: Silicon-Based Technology Corp., Hsinchu (TW)

( * ) Notice: Subject to any disclaimer, the term of this patent is extended or adjusted under 35 U.S.C. 154(b) by 0 days.

(21) Appl. No.: 10/997,953

(22) Filed: Nov. 29, 2004

(51) Int. Cl.⁷ .............................................. H01L 29/76
(52) U.S. Cl. ...................... 257/328; 257/329; 257/335; 257/341; 438/268; 438/299
(58) Field of Search ................................ 438/268, 299, 438/303; 257/328, 329, 335, 341

(56) References Cited

U.S. PATENT DOCUMENTS

| | | | |
|---|---|---|---|
| 5,930,630 A * | 7/1999 | Hshieh et al. ............... | 438/268 |
| 6,121,089 A * | 9/2000 | Zeng et al. ................. | 438/268 |
| 6,277,695 B1 * | 8/2001 | Williams et al. ............ | 438/268 |
| 6,369,425 B1 * | 4/2002 | Ferla et al. ................. | 257/341 |
| 6,747,312 B2 * | 6/2004 | Boden, Jr. .................. | 257/327 |

* cited by examiner

Primary Examiner—Trung Dang
(74) Attorney, Agent, or Firm—Dennison, Schultz, Dougherty & MacDonald

(57) ABSTRACT

A self-aligned planar DMOS transistor structure is disclosed, in which a p-body diffusion region is selectively formed in an $n^-/n^+$ epitaxial silicon substrate; a self-aligned $p^+$ contact diffusion region is formed within the p-body diffusion region through a first self-aligned implantation window surrounded by a first sacrificial dielectric spacer; a self-aligned $n^+$ source diffusion ring is formed in a surface portion of the p-body diffusion region through a second self-aligned implantation window formed between a protection dielectric layer and a self-aligned implantation masking layer surrounded by the sacrificial dielectric spacer; a self-aligned source contact window is formed on the self-aligned $n^+$ source diffusion ring surrounded by a sidewall dielectric spacer and on the self-aligned $p^+$ contact diffusion region surrounded by the self-aligned $n^+$ source diffusion ring; and a heavily-doped polycrystalline-silicon gate layer is selectively silicided in a self-aligned manner.

20 Claims, 6 Drawing Sheets

SELF-ALIGNED PLANAR DMOS TRANSISTOR STRUCTURE AND ITS MANUFACTURING METHODS

BACKGROUND OF THE INVENTION

1. Field of the Invention

The present invention relates generally to a planar DMOS power transistor and its manufacturing method and, more particularly, to a self-aligned planar DMOS transistor structure and its manufacturing methods.

2. Description of the Prior Art

A DMOS power transistor with very low on-resistance has become an important device for applications in battery protection, switching, linear regulator, amplifier and power management. It is known that device ruggedness becomes a major reliability issue for the DMOS power transistor and the device ruggedness due to parasitic bipolar transistors formed among source, body and drain becomes a major concern. The parasitic bipolar transistors can be activated to cause a snap-back effect which can result in permanent damages to the DMOS power transistor. Several methods had been proposed to improve parasitic resistances of the parasitic bipolar transistors, however additional critical masking photoresist steps are in general required.

FIG. 1A shows a schematic cross-sectional view for a non self-aligned source structure of a prior-art planar DMOS transistor as disclosed in U.S. Pat. No. 5,268,586 by Mukherjee et al., in which a p-body diffusion region 50 is formed in an $n^-$ epitaxial silicon layer 40 on an $n^+$ silicon substrate 30 through a first implantation window (not shown) surrounded by a patterned polycrystalline-silicon gate layer 80 on a gate oxide layer 70 using a first masking photoresist step; an $n^+$ source diffusion ring 60 is formed in a surface portion of the p-body diffusion region 50 through a second implantation window (not shown) formed between a patterned second masking photoresist layer (not shown) being formed on a middle portion of the p-body diffusion region 50 and the patterned polycrystalline-silicon gate layer 80 on the gate oxide layer 70; a $p^+$ diffusion region 100 is formed within the p-body diffusion region 50 by a high-energy ion implantation through the first implantation window surrounded by the patterned polycrystalline-silicon gate layer 80 on the gate oxide layer 70; a source contact window is formed by an opening through a silicon oxide layer 90 using a third masking photoresist step (not shown); and a contact metal layer 101 is formed on a portion of the $n^+$ source diffusion ring 60 and the $p^+$ diffusion region 100 surrounded by the $n^+$ source diffusion ring 60.

Apparently, three masking photoresist steps are required to form the non self-aligned source structure shown in FIG. 1A, in which two critical masking photoresist steps (second and third masking photoresist steps) are required and non-uniform current distribution due to non-uniform $n^+$ contact width and parasitic $n^+$ source diffusion ring resistance are inevitable. It is clearly seen that the $p^+$ diffusion ring 100 formed by the high-energy ion implantation must have a peak doping concentration smaller than a tail doping concentration in the $n^+$ source diffusion ring 60 without increasing the parasitic $n^+$ source diffusion ring resistance and the contact resistance of the contact metal layer 101 on the $p^+$ diffusion region 100 becomes larger due to a lower surface doping concentration of the $p^+$ diffusion region 100. Moreover, it is clearly visualized that poor metal step coverage or a larger parasitic capacitance between the contact metal layer 101 and the patterned polycrystalline-silicon gate layer 80 is obtained.

FIG. 1B shows a schematic cross-sectional view for a non self-aligned source structure of another prior-art planar DMOS power transistor as disclosed in U.S. Pat. No. 5,930,630 by Hshieh et al., in which a p-body diffusion region 130 is formed in an $n^-$ epitaxial silicon layer 110 on an $n^+$ silicon substrate 105 through a first implantation window (not shown) surrounded by a patterned polycrystalline-silicon gate layer 125 on a gate oxide layer 120 using a first masking photoresist step; Similarly, an $n^+$ source diffusion ring 140 is formed through a second implantation window formed between a patterned second masking photoresist layer (not shown) being formed on a middle portion of the p-body diffusion region 130 and the patterned polycrystalline-silicon gate layer 125 on the gate oxide layer 120 by using a second masking photoresist step (not shown); a third implantation window is formed through a BP-glass layer 145 over a P-glass layer 148 on the gate oxide layer 120 by using a third masking photoresist step; a high-energy and a low-energy implantations are performed in sequence to form a deep $p^+$ diffusion region 165 and a shallow $p^+$ diffusion region 160; a shallow trench is performed on an exposed $n^+$ source diffusion ring 140 and the shallow $p^+$ diffusion region 160 through the third implantation window; and a contact metal layer 170 is formed on the shallow trench and over a reflow BP-glass layer 145 over the P-glass layer 148 on the gate oxide layer 120.

Apparently, three masking photoresist steps are also required to form FIG. 1B, in which two critical masking photoresist steps (second and third masking photoresist steps) are also required, as those described in FIG. 1A. It is clearly seen that the shallow trench used to reveal the peak doping concentration portion of the shallow $p^+$ diffusion region 160 may simultaneously remove the peak doping concentration portion of the $n^+$ source diffusion ring 140, resulting in an increase of the parasitic $n^+$ source diffusion ring resistance and the contact resistance between the contact metal layer 170 and the trenched $n^+$ source diffusion ring 140. It should be emphasized that the doping concentration of the shallow $p^+$ diffusion region 160 in FIG. 1B must keep to be smaller than the doping concentration in the $n^+$ source diffusion ring 140, therefore the shallow trench doesn't improve an overall contact resistance of the $n^+$ source diffusion ring 140 and the p-body diffusion region 130.

From FIG. 1A and FIG. 1B, it is clearly seen that three masking photoresist steps are required to form the non self-aligned source structure, in which two critical masking photoresist steps used may produce non-uniform $n^+$ source diffusion ring 60/140 and non-uniform contact width between the $n^+$ source diffusion ring 60/140 and the contact metal layer 101/170 and the contact resistance between the $p^+$ diffusion region 100/160 and the contact metal layer 101/170 is higher due to a lower surface doping concentration in the $p^+$ diffusion region 100/160. Apparently, non-uniform current flow may occur for either DMOS transistor cell or parasitic npn and pnp bipolar transistors due to misalignments of the critical masking photoresist steps, especially as source area of a DMOS transistor cell is reduced. Moreover, it is clearly visualized that the patterned polycrystalline-silicon gate layer 80/125 being used as a gate interconnection layer will produce a large parasitic gate interconnection resistance for a planar DMOS power transistor and results in a lower switching speed.

It is, therefore, a major objective of the present invention to offer a fully self-aligned planar DMOS transistor structure in order to eliminate all detrimental effects due to misalignments of the critical masking photoresist steps.

It is another objective of the present invention to offer a fully self-aligned planar DMOS transistor structure being fabricated by using only one masking photoresist step.

It is a further objective of the present invention to offer a scalable self-aligned planar DMOS transistor structure with a minimized cell size and a reduced gate-interconnection parasitic resistance.

SUMMARY OF THE INVENTION

The present invention discloses a self-aligned planar DMOS transistor and its manufacturing methods. A first-type self-aligned planar DMOS transistor structure comprises a p-body diffusion region being formed in an n$^-$ epitaxial silicon layer on an n$^+$ silicon substrate through a patterned window surrounded by a patterned capping dielectric layer on a patterned heavily-doped polycrystalline-silicon gate layer and on a gate dielectric layer, wherein the patterned capping dielectric layer on the patterned heavily-doped polycrystalline-silicon gate layer is patterned by a masking photoresist step; a self-aligned p$^+$ contact diffusion region being formed within the p-body diffusion region through a first self-aligned implantation window surrounded by a first sacrificial dielectric spacer, wherein the first sacrificial dielectric spacer is formed over a sidewall of a protection dielectric layer and on a side portion of the protection dielectric layer and the protection dielectric layer is formed over a sidewall of the patterned capping dielectric layer on the patterned heavily-doped polycrystalline-silicon gate layer and on a side portion of the gate dielectric layer surrounded by the patterned heavily-doped polycrystalline-silicon gate layer; a self-aligned n$^+$ source diffusion ring being formed in a surface portion of the p-body diffusion region and on a portion of the self-aligned p$^+$ contact diffusion region through a second self-aligned implantation window between a sidewall portion of the protection dielectric layer and a self-aligned implantation masking layer being formed on the protection dielectric layer surrounded by the first sacrificial dielectric spacer; a self-aligned source contact window being formed by the self-aligned n$^+$ source diffusion ring surrounded by a sidewall dielectric spacer and the self-aligned p$^+$ contact diffusion region surrounded by the self-aligned n$^+$ source diffusion ring, wherein the sidewall dielectric spacer is formed over a sidewall of the protection dielectric layer and on a side portion of the protection dielectric layer; and a source metal layer being at least formed over the self-aligned source contact window, the sidewall dielectric spacer and the patterned capping dielectric layer, wherein the source metal layer may comprise a metal silicide layer being formed over the self-aligned source contact window by using a self-aligned silicidation process and a metal layer over a barrier metal layer being at least formed over the metal silicide layer, the sidewall dielectric spacer and the patterned capping dielectric layer.

A second-type self-aligned planar DMOS transistor structure is similar to that of the first-type self-aligned planar DMOS transistor structure except that a self-aligned deeper p$^-$ diffusion region is formed through a third self-aligned implantation window surrounded by a second sacrificial dielectric spacer being formed over an inner sidewall in each of the plurality of source regions (SR) before forming the p-body diffusion region, in which the second sacrificial dielectric spacer is removed after ion implantation for forming the self-aligned deeper p$^-$ diffusion region.

Similarly, a self-aligned planar p-DMOS transistor structure and its manufacturing methods can be obtained by changing the doping types formed in the semiconductor substrate. Moreover, the self-aligned planar DMOS transistor structure of the present invention can be applied to fabricate an insulated-gate bipolar transistor (IGBT) or a MOS-controlled thyristor (MCT).

BRIEF DESCRIPTION OF THE DRAWINGS

FIG. 1A and FIG. 1B show schematic cross-sectional views of prior-art planar DMOS transistor structures, in which FIG. 1A shows a schematic cross-sectional view of a prior-art planar DMOS transistor structure and FIG. 1B shows a schematic cross-sectional view of another prior-art planar DMOS transistor structure.

DETAILED DESCRIPTION OF THE PREFERRED EMBODIMENTS

Referring now to FIG. 2A through FIG. 2L, there are shown process steps and their cross-sectional views of fabricating a first-type self-aligned planar DMOS transistor structure of the present invention.

Figure 1A:
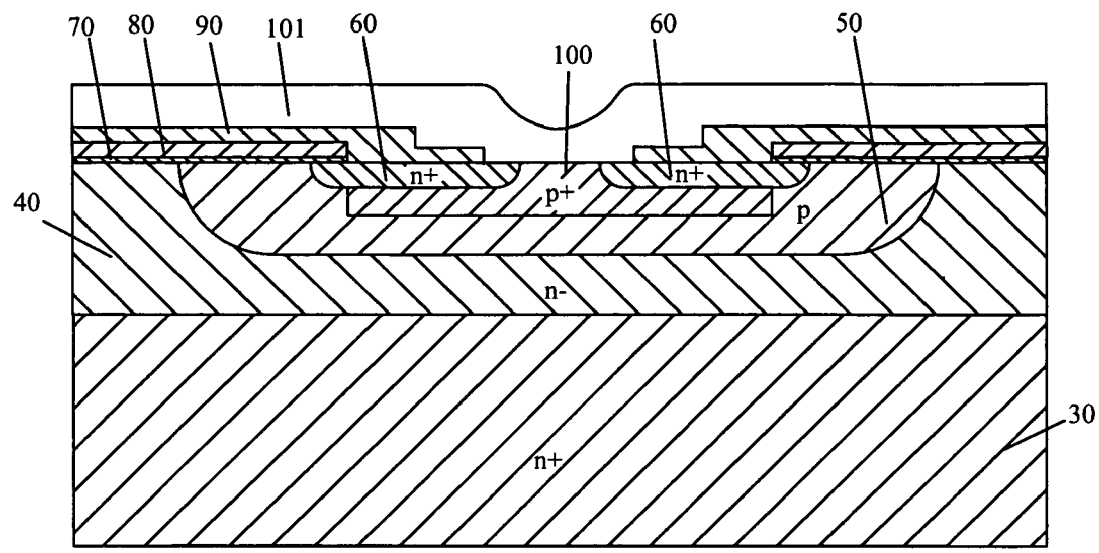
Figure 1B:
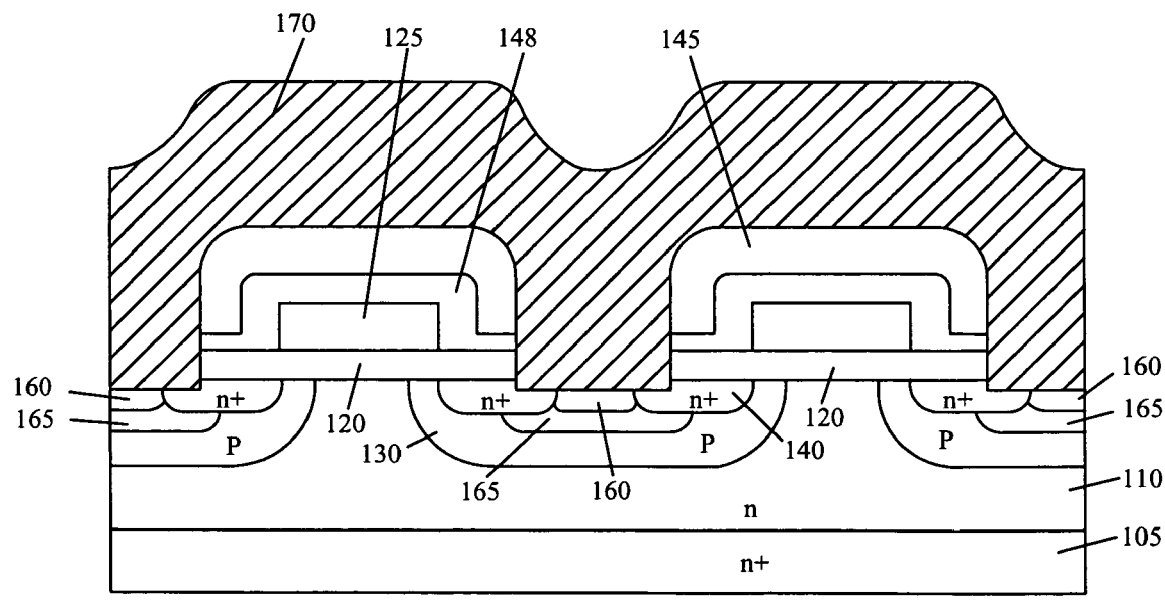
Figure 2A:
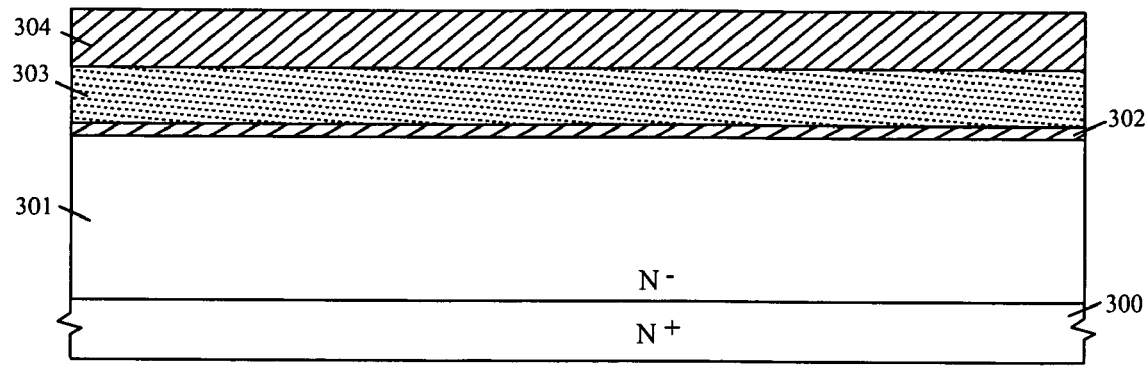
FIG. 2A through FIG. 2I show process steps and their schematic cross-sectional views of fabricating a first-type self-aligned planar DMOS transistor structure of the present invention.

FIG. 2A shows that a gate dielectric layer 302 is formed over an n$^-$ epitaxial silicon layer 301 on an n$^+$ silicon substrate 300; a heavily-doped polycrystalline-silicon gate layer 303 is then formed on the gate dielectric layer 302; and subsequently, a capping dielectric layer 304 is formed on the heavily-doped polycrystalline-silicon gate layer 303. The gate dielectric layer 302 is preferably a thermal silicon dioxide layer or a nitrided thermal silicon dioxide layer and its thickness is preferably between 200 Angstroms and 1000 Angstroms. The n$^-$ epitaxial silicon layer 301 has a doping concentration between 10$^{14}$/cm$^3$ and 5×10$^{16}$/cm$^3$ and a thickness between 2 $\mu$m and 35 $\mu$m. The n$^+$ silicon substrate 300 has a doping concentration between 5×10$^{18}$/cm$^3$ and 5×10$^{20}$/cm$^3$ and a thickness between 250 $\mu$m and 800 $\mu$m, depending on wafer size. The heavily-doped polycrystalline-silicon gate layer 303 is preferably deposited by low-pressure chemical vapor deposition (LPCVD) and is heavily doped with a doping concentration between 5×10$^{18}$/cm$^3$ and 5×10$^{20}$/cm$^3$ through in-situ or thermal diffusion process and its thickness is preferably between 2500 Angstroms and 6000 Angstroms. The capping dielectric layer 304 is preferably made of silicon dioxide, phosphosilicate glass (P-glass) or boro-phosphosilicate glass (BP-glass) as deposited by chemical vapor deposition (CVD) or high-density plasma (HDP) CVD and its thickness is preferably between 4000 Angstroms and 8000 Angstroms.

Figure 2B:
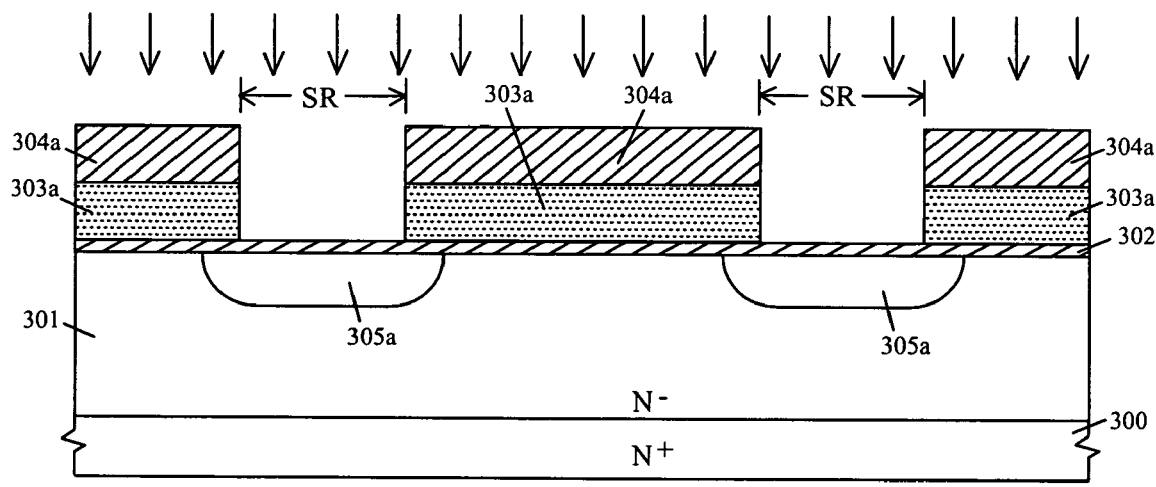

FIG. 2B shows that a masking photoresist (PR1) step (not shown) is performed to define a plurality of source regions (SR); the capping dielectric layer 304 and the heavily-doped polycrystalline-silicon gate layer 303 in the plurality of source regions (SR) are removed in sequence by using anisotropic dry etching to form a patterned capping dielectric layer 304a on a patterned heavily-doped polycrystalline-silicon gate layer 303a; and subsequently, ion implantation is performed in a self-aligned manner by implanting a moderate dose of boron doping impurities across the gate dielectric layer 302 through a patterned window in each of the plurality of source regions (SR) into a surface portion of the n⁻ epitaxial silicon layer 301 and a drive-in process is then performed to form a p-body diffusion region 305a in each of the plurality of source regions (SR). It should be emphasized that the p-body diffusion region 305a can be formed by a conventional thermal diffusion process by removing the gate dielectric layer 302 in each of the plurality of source regions (SR) before stripping the patterned masking photoresist (PR1); a thermal oxide layer (not shown) can be grown over the p-body diffusion region 305a in each of the plurality of source regions (SR) after the conventional diffusion process and a thin polyoxide layer (not shown) is simultaneously formed over a sidewall of the patterned heavily-doped polycrystalline-silicon gate layer 303a. It should be noted that FIG. 2B shows a cross-sectional view for only two of the plurality of source regions (SR) and each of the plurality of source regions (SR) can be patterned to be but not limited to rectangular, square, hexagonal, round or elliptical, and so forth. It should be noted that the moderate dose means a dose of ion implantation between $5 \times 10^{13}/cm^2$ and $5 \times 10^{14}/cm^2$.

Figure 2C:
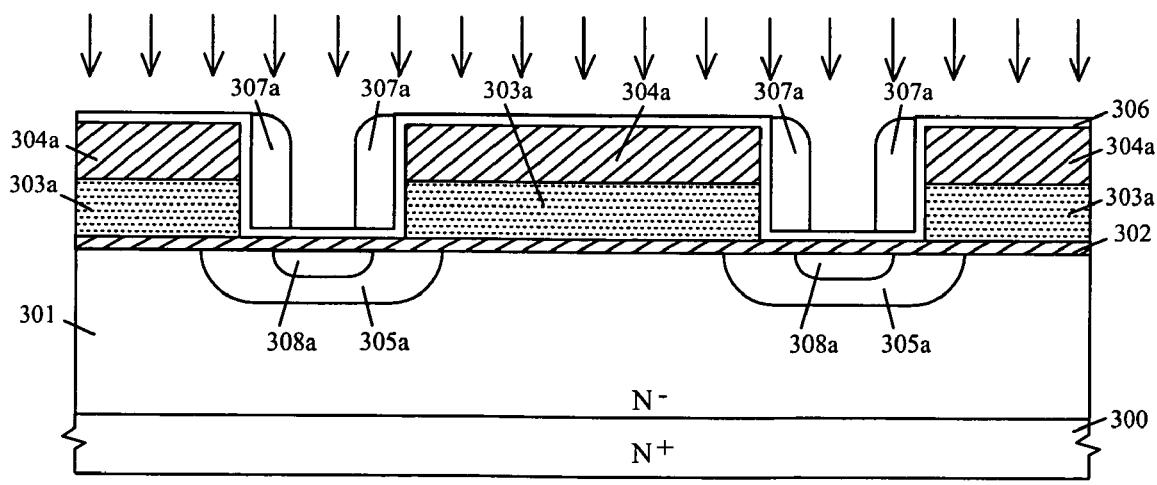

FIG. 2C shows that a protection dielectric layer 306 is formed over a formed structure surface including the patterned capping dielectric layer 304a on the patterned heavily-doped polycrystalline-silicon gate layer 303a and the gate dielectric layer 302 in each of the plurality of source regions (SR); a first sacrificial dielectric spacer 307a is then formed over a sidewall of the protection dielectric layer 306 and on a side portion of the protection dielectric layer 306 in each of the plurality of source regions (SR); and a shallow ion implantation is then performed in a self-aligned manner to implant a high dose of boron doping impurities across the protection dielectric layer 306 on the gate dielectric layer 302 through a first self-aligned implantation window being surrounded by the first sacrificial dielectric spacer 307a into a surface portion of the p-body diffusion region 305a; and subsequently, a drive-in process is performed to form a self-aligned p⁺ contact diffusion region 308a within each of the p-body diffusion regions 305a. The protection dielectric layer 306 is preferably a silicon nitride layer as deposited by LPCVD and its thickness is preferably between 50 Angstroms and 300 Angstroms. The first sacrificial dielectric spacer 307a is preferably made of silicon dioxide as deposited by LPCVD and is formed by first depositing a silicon dioxide layer 307 (not shown) over a formed structure surface and then etching back a thickness of the deposited silicon dioxide layer 307. It should be noted that the high dose of boron doping impurities means a dose of ion implantation larger than $10^{15}/cm^2$.

Figure 2D:
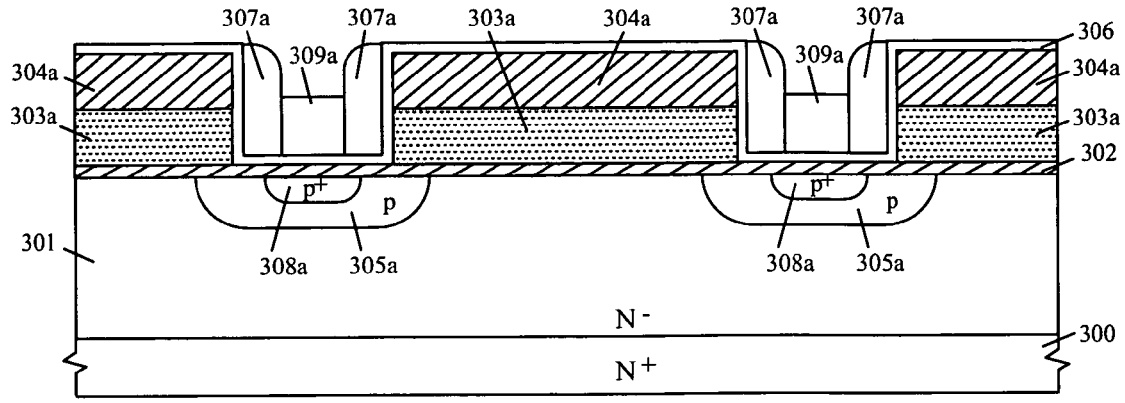

FIG. 2D shows that a self-aligned implantation masking layer 309a is formed on the protection dielectric layer 306 surrounded by the first sacrificial dielectric spacer 307a in each of the plurality of source regions (SR). The self-aligned implantation masking layer 309a can be an etched-back organic polymer material and is formed by spinning on an organic polymer film 309 (not shown) over the wafer and then etching back the organic polymer film 309 to a predetermined thickness. It should be noted that the etched-back organic polymer film 309a can be made of photoresist, polyimide or other organic polymer materials and can also be replaced by an etched-back polycrystalline-silicon layer.

Figure 2E:
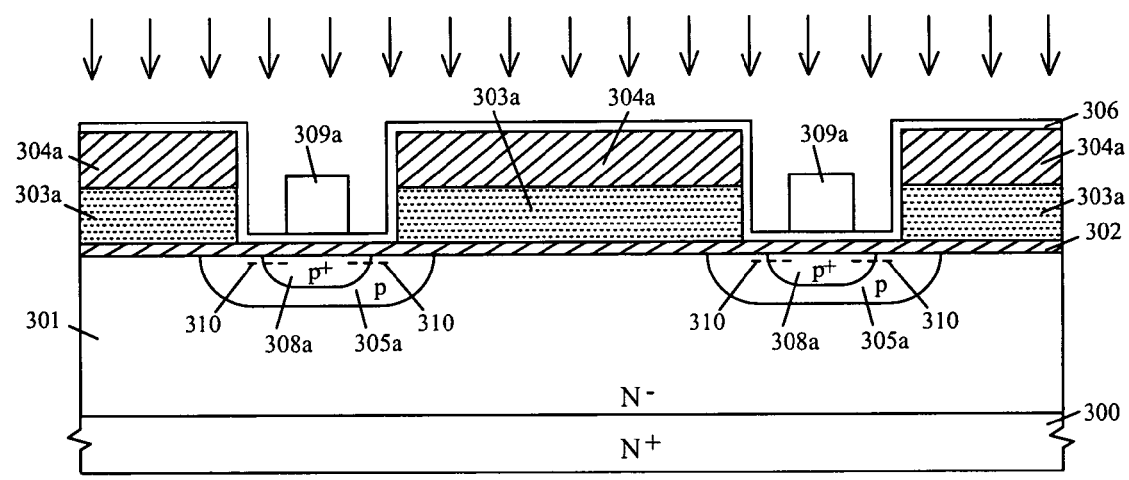

FIG. 2E shows that the first sacrificial dielectric spacer 307a in each of the plurality of source regions (SR) is removed by buffered hydrofluoric acid to form a second self-aligned implantation window; and ion implantation is then performed in a self-aligned manner by implanting a high dose of phosphorous or arsenic doping impurities across the protection dielectric layer 306 on the gate oxide layer 302 into a surface portion of the p-body diffusion region 305a through the second self-aligned implantation window being formed between the protection dielectric layer 306 and the self-aligned implantation masking layer 309a to form implanted regions 310. It is also noted that the high dose of phosphorous or arsenic doping impurities means a dose of ion implantation larger than $10^{15}/cm^2$.

Figure 2F:
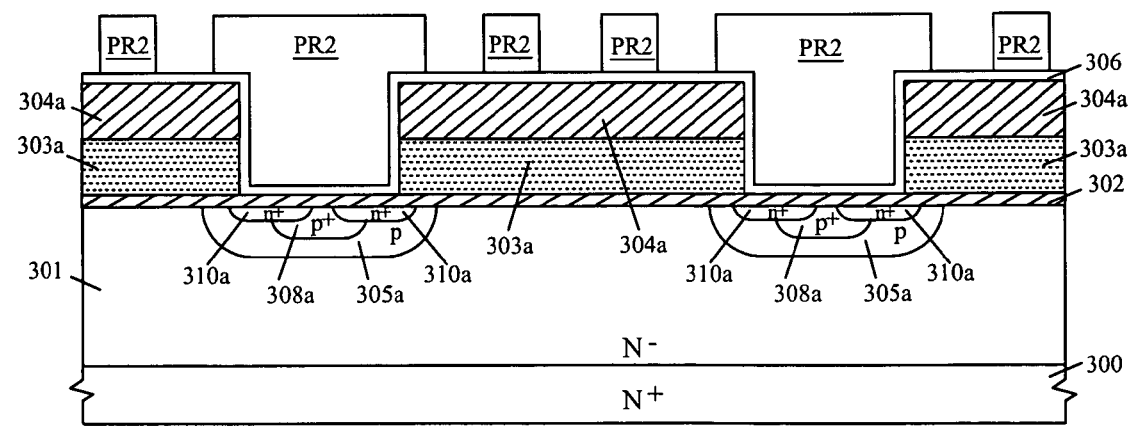

FIG. 2F shows that the self-aligned implantation masking layer 309a in each of the plurality of source regions (SR) is removed by wet chemicals or anisotropic dry etching; and a drive-in process is then performed to form a self-aligned n⁺ source diffusion ring 310a in each of the plurality of source regions (SR); and subsequently, a masking photoresist (PR2) step is performed to define silicidation regions on the patterned heavily-doped polycrystalline-silicon gate layer 303a.

Figure 2G:
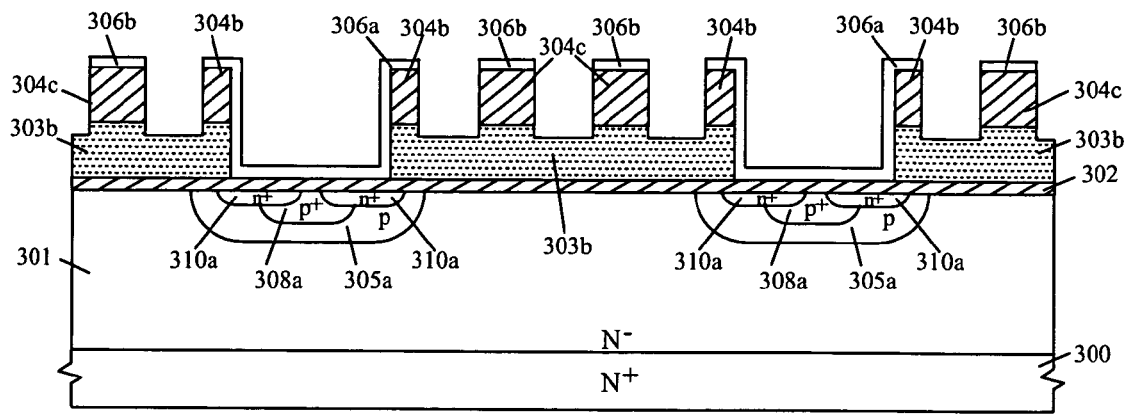

FIG. 2G shows that the protection dielectric layer 306 and the patterned capping dielectric layer 304a outside of the patterned masking photoresist (PR2) are sequentially removed by using anisotropic dry etching and the patterned masking photoresist (PR2) are then stripped. It should be noted that the patterned heavily-doped polycrystalline-silicon gate layer 303a can be slightly etched to form shallow trenches by using anisotropic dry etching, as shown in FIG. 2G.

Figure 2H:
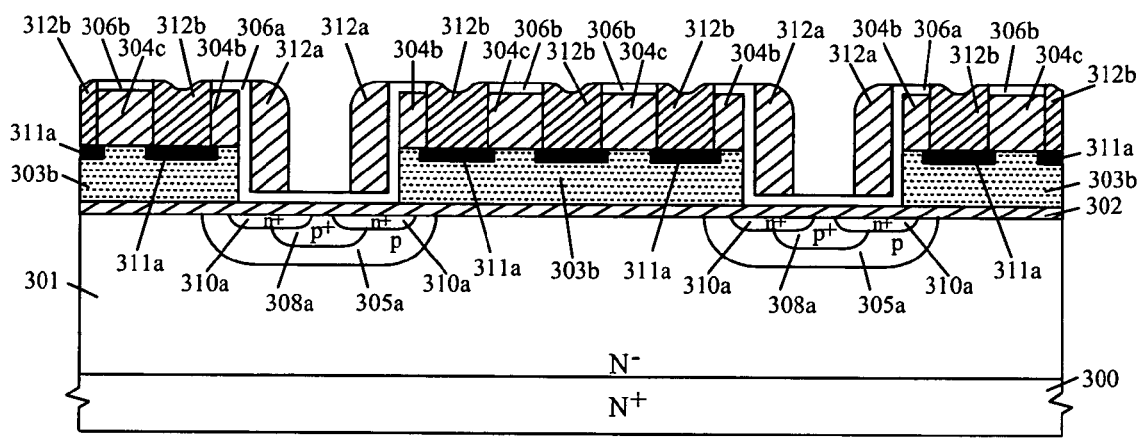

FIG. 2H shows that a self-aligned silicidation process is performed to form a metal silicide layer 311a on each of exposed heavily-doped polycrystalline-silicon gate layer 303b; and a sidewall dielectric spacer 312a is formed over a sidewall of the patterned protection dielectric layer 306a in each of the plurality of source regions (SR); and simultaneously, a refilled dielectric layer 312b is formed to fill each gap on the silicidation regions. The sidewall dielectric spacer 312a is preferably made of silicon dioxide as deposited by LPCVD and is formed by first depositing a silicon dioxide layer 312 (not shown) over a formed structure surface and then etching back a thickness of the deposited silicon dioxide layer 312. It should be noted that the sidewall dielectric spacer 312a can be made of silicon nitride as deposited by LPCVD and a width of the silicidation regions must be controlled to be smaller than two times of a spacer width formed for the sidewall dielectric spacer 312a in order to fill a gap on the silicidation region.

Figure 2I:
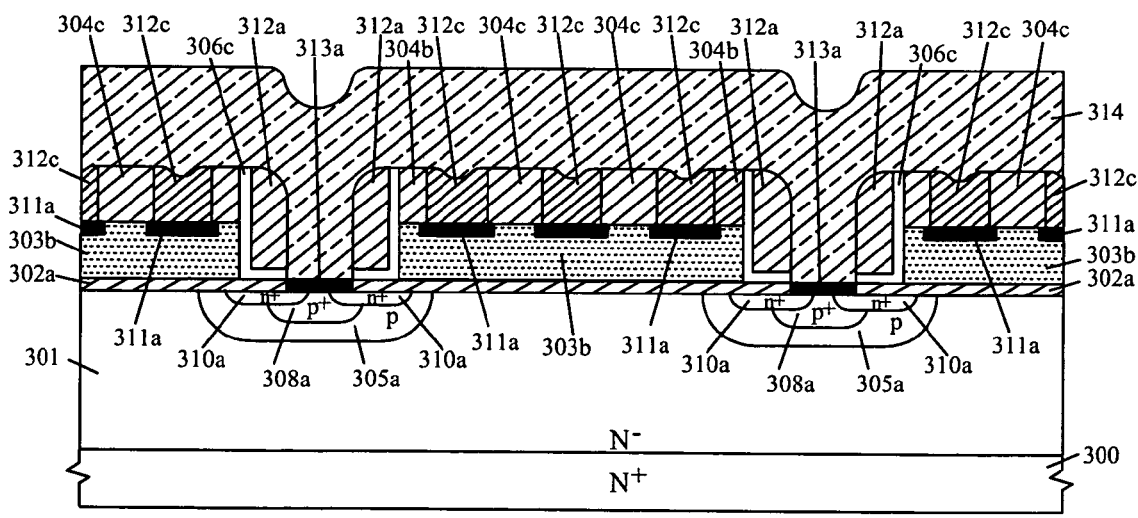

FIG. 2I shows that the patterned protection dielectric layers 306a, 306b outside of the sidewall dielectric spacer 312a are removed by anisotropic dry etching; the gate dielectric layer 302 surrounded by the sidewall dielectric spacer 312a in each of the plurality of source regions (SR) is then removed by buffered hydrofluoric acid or anisotropic dry etching to form a self-aligned source contact window; a metal silicide layer 313a is then formed on the self-aligned n⁺ source diffusion ring 310a surrounded by the sidewall dielectric spacer 312a and the self-aligned p⁺ contact diffusion region 308a surrounded by the self-aligned n⁺ source diffusion ring 310a through the self-aligned source contact window in each of the plurality of source regions (SR) using a well-known self-aligned silicidation process; and subsequently, a metal layer 314 is formed over the metal silicide layer 313a, the sidewall dielectric spacer 312a and the patterned protection dielectric layers 306c in each of the plurality of source regions (SR) and on the patterned capping dielectric layers 304b, 304c and the refilled dielectric layers 312c. The metal layer 314 may comprise a silver (Ag), aluminum (Al) or gold (Au) layer on a barrier metal layer and the barrier metal layer may comprise a refractory metal nitride layer. The metal silicide layer 313a comprises a refractory metal silicide layer, such as titanium disilicide (TiSi$_2$), nickel disilicide (NiSi$_2$), cobalt disilicide (CoSi$_2$), molybdenum disilicide (MoSi$_2$), tantalum disilicide (TaSi$_2$), platinum disilicide (PtSi$_2$), palladium disilicide (PaSi$_2$) or tungsten disilicide (WSi$_2$) and so forth.

From FIG. 2I, it is clearly seen that only one masking photoresist step is required to form the self-aligned source structure of the present invention; the self-aligned n$^+$ source diffusion ring 310a and the self-aligned p$^+$ contact diffusion region 308a are formed in a self-aligned manner to be heavily doped, uniform current flow of a planar DMOS power transistor cell is expected; the source contact resistance is expected to be smaller due to higher surface doping concentrations (10$^{20}$/cm$^3$) in both the self-aligned n$^+$ source diffusion ring 310a and the self-aligned p$^+$ contact diffusion region 308a, area of the source region (SR) can be easily scaled down further; and a portion of the self-aligned p$^+$ contact diffusion region 308a is formed under the self-aligned n$^+$ source diffusion ring 310a, the parasitic base resistance of the parasitic npn bipolar transistor is much reduced, and the ruggedness of the planar DMOS power transistor is therefore improved. Moreover, the heavily-doped polycrystalline-silicon gate layer 303b is locally silicided to improve gate-interconnection parasitic resistance.

Referring now to FIG. 3A through FIG. 3D, there are shown simplified process steps after FIG. 2A and their schematic cross-sectional views of fabricating a second-type self-aligned planar DMOS transistor structure of the present invention.

Figure 3A:
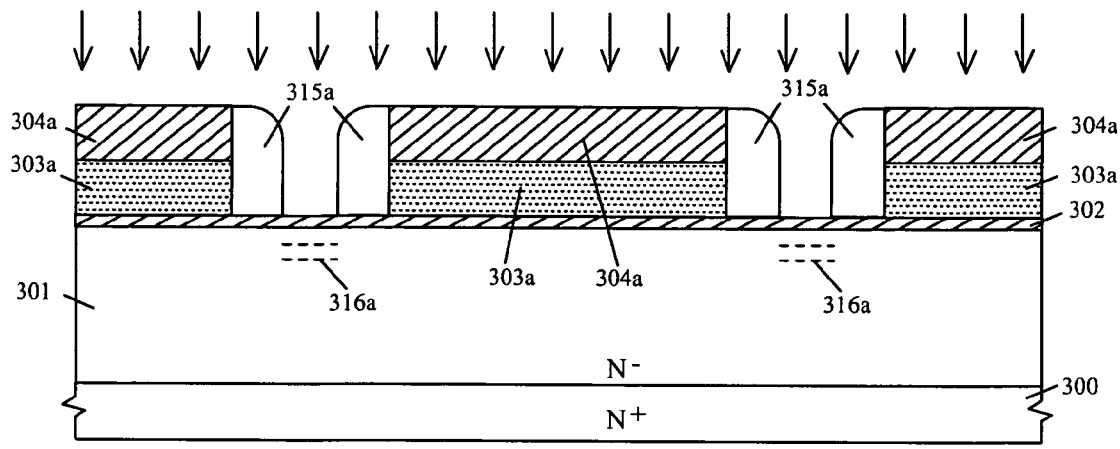
FIG. 3A through FIG. 3D show simplified process steps after FIG. 2A and their schematic cross-sectional views of fabricating a second-type self-aligned planar DMOS transistor structure of the present invention.

FIG. 3A shows that a masking photoresist (PR1) step (not shown) is performed for FIG. 2A to define a plurality of source regions (SR) as described in FIG. 2B; the capping dielectric layer 304 and the heavily-doped polycrystalline-silicon gate layer 303 outside of the masking photoresist (PR1) are removed in sequence by using anisotropic dry etching and the masking photoresist (PR1) are then stripped; subsequently, a second sacrificial dielectric spacer 315a is formed over a sidewall of the patterned capping dielectric layer 304a on the patterned heavily-doped polycrystalline-silicon gate layer 303a to form a third self-aligned implantation window in each of the plurality of source regions (SR); and thereafter, a high-energy boron implantation is performed to form a deeper implant region 316a in the n$^-$ epitaxial silicon layer 301 through the third self-aligned implantation window in each of the plurality of source regions (SR). The second sacrificial dielectric spacer 315a is preferably made of silicon nitride as deposited by LPCVD and is formed by first depositing a silicon nitride layer 315 (not shown) over a formed structure surface and then etching back a thickness of the deposited silicon nitride layer 315 by using anisotropic dry etching.

Figure 3B:
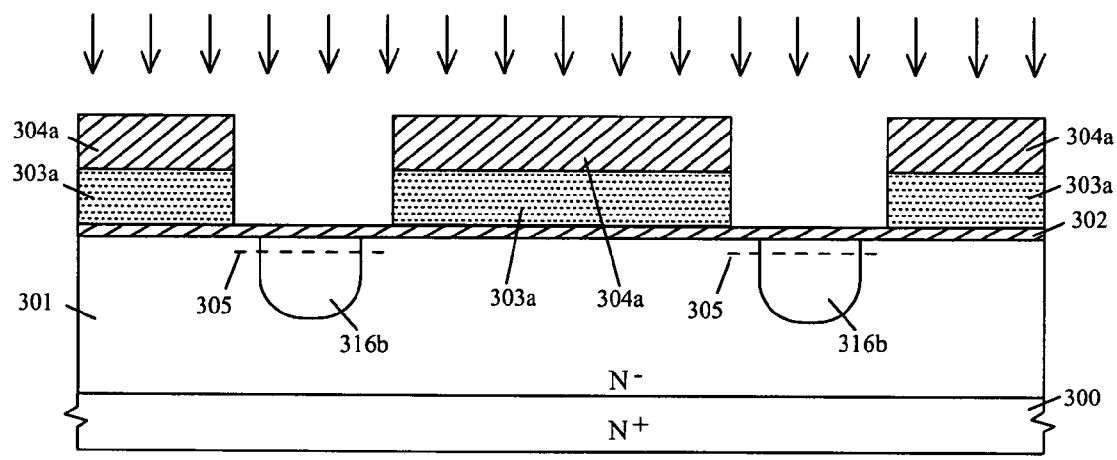

FIG. 3B shows that the second sacrificial dielectric spacer 315a in each of the plurality of source regions (SR) is removed by hot-phosphoric acid or anisotropic dry etching; a drive-in process is then performed to form a lightly-doped p$^-$ diffusion region 316b in each of the plurality of source regions (SR); and subsequently, a boron implantation is performed to form a moderate-dose implant region 305 in a surface portion of the lightly-doped p$^-$ diffusion region 316b and the n$^-$ epitaxial silicon layer 301 in each of the plurality of source regions (SR).

Figure 3C:
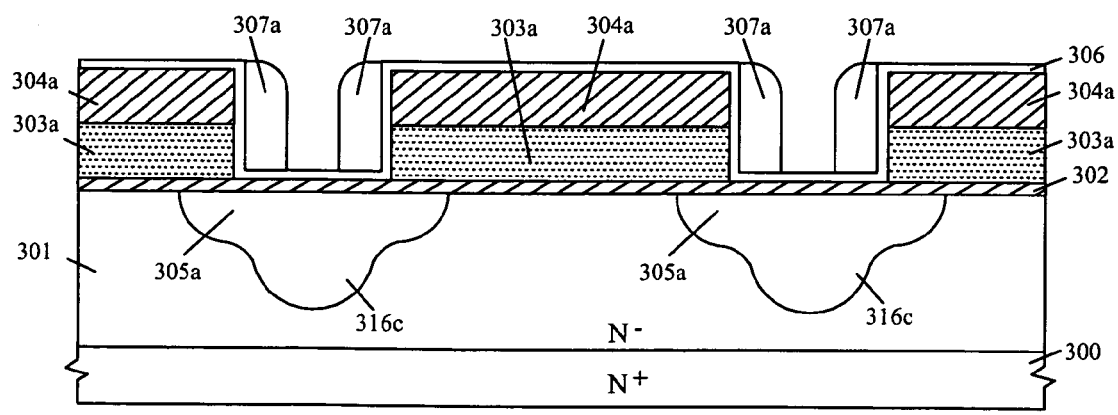
Figure 3D:
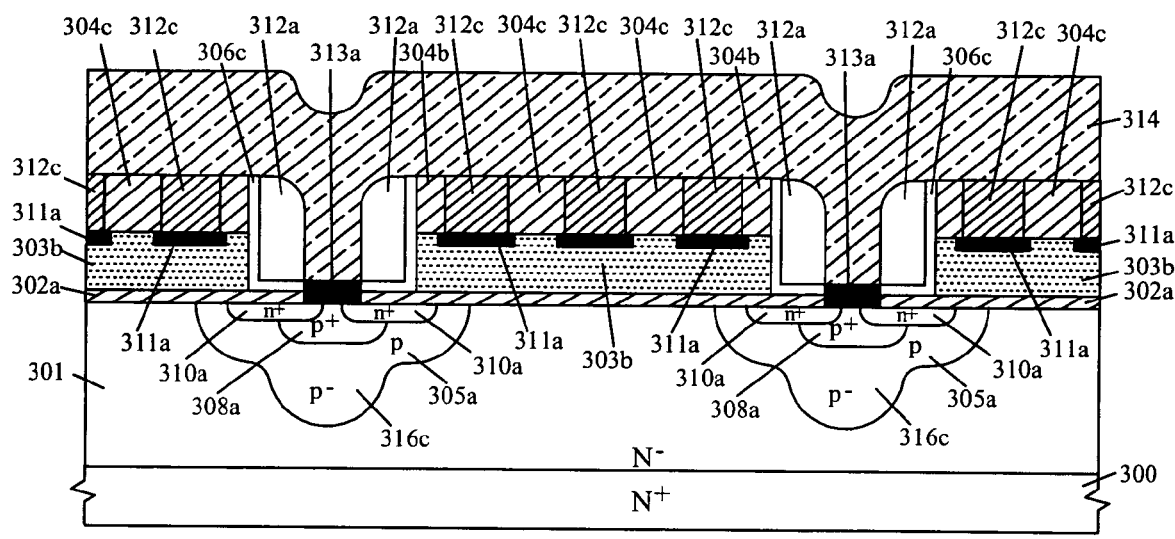

FIG. 3C shows that a drive-in process is performed to form a p-body diffusion region 305a with a self-aligned lightly-doped p$^-$ diffusion region 316c being formed beneath a middle portion of the p-iffusion region 305a in each of the plurality of source regions (SR); a protection dielectric layer 306 is then formed over a formed structure surface; and subsequently, a first sacrificial dielectric spacer 307a is formed over a sidewall of the protection dielectric layer 306 and on a side portion of the protection dielectric layer 306 in each of the plurality of source regions (SR), as described in FIG. 2C.

Following the same process steps shown in FIG. 2D through FIG. 2I, FIG. 3D can be easily obtained. It is clearly seen that the self-aligned lightly-doped p$^-$ diffusion region 316c in each of the plurality of source regions (SR) is formed in a self-aligned manner to further increase the breakdown voltage of the self-aligned planar DMOS transistor structure of the present invention.

Apparently, the advantages and features of the self-aligned planar DMOS transistor structures of the present invention as described above can be summarized of follows:

(a) The self-aligned planar DMOS transistor structure of the present invention offers a self-aligned source structure being fabricated by using only one masking photoresist step.

(b) The self-aligned planar DMOS transistor structure of the present invention offers a self-aligned n$^+$ source diffusion ring and a self-aligned p$^+$ contact diffusion region to improve source contact resistance and device ruggedness.

(c) The self-aligned planar DMOS transistor structure of the present invention offers locally-silicided polycrystalline-silicon gate layer to improve gate-interconnection parasitic resistance.

(d) The self-aligned planar DMOS transistor structure of the present invention offers a self-aligned lightly-doped p$^-$ diffusion region beneath a middle portion of the p-body diffusion region to improve device breakdown voltage.

It should be noted that the self-aligned n-channel planar DMOS transistor structure and its manufacture methods as described above can be easily revised to be valid for self-aligned p-channel planar DMOS transistor structure if opposite doping types are used in different semiconductor regions. Moreover, it is quite apparent that the self-aligned planar DMOS transistor structure and its manufacturing methods can be easily extended to describe an insulated-gate bipolar transistor (IGBT) and a MOS-controlled thyristor (MCT).

While the present invention has been particularly shown and described with reference to the present examples and embodiments as considered as illustrative and not restrictive. Moreover, the present invention is not to be limited to the details given herein, it will be understood by those skilled in the art that various changes in forms and details may be made without departure from the true spirit and scope of the present invention.

What is claimed is:

1. A self-aligned planar DMOS transistor structure, comprising:
a semiconductor substrate of a first conductivity type, wherein the semiconductor substrate comprises a lightly-doped epitaxial semiconductor layer being formed on a heavily-doped semiconductor substrate;
a source region being formed in the lightly-doped epitaxial semiconductor layer surrounded by a planar gate region, wherein the source region comprises a body diffusion region of a second conductivity type being formed in the lightly-doped epitaxial semiconductor layer through a patterned window, a self-aligned heavily-doped contact diffusion region of the second conductivity type being formed in a middle surface portion of the body diffusion region through a first self-aligned implantation window surrounded by a first sacrificial dielectric spacer, a self-aligned heavily-doped source diffusion ring of the first conductivity type being formed in a surface portion of the body diffusion region and on an extended side surface portion of the self-aligned heavily-doped contact diffusion region through a second self-aligned implantation window formed between a self-aligned implantation masking layer surrounded by the first sacrificial dielectric spacer and a protection dielectric layer being formed over a sidewall of the planar gate region, and a self-aligned contact window being formed on a surface portion of the self-aligned heavily-doped contact diffusion region surrounded by the self-aligned heavily-doped source diffusion ring and the self-aligned heavily-doped source diffusion ring surrounded by a sidewall dielectric spacer being formed over a sidewall of the protection dielectric layer;

the planar gate region being formed on the lightly-doped epitaxial semiconductor layer, wherein the planar gate region comprises a patterned heavily-doped polycrystalline-silicon gate layer being formed on a gate dielectric layer, self-aligned metal silicide layers being formed on the patterned heavily-doped polycrystalline-silicon gate layer through gaps formed by patterned capping dielectric layers, and refilled dielectric layers being formed on the self-aligned metal silicide layers; and a source metal layer being at least formed on the self-aligned source contact window.

2. The self-aligned planar DMOS transistor structure according to claim 1, wherein the semiconductor substrate is made of single crystalline-silicon material.

3. The self-aligned planar DMOS transistor structure according to claim 1, wherein the source region is patterned by a masking photoresist step with a capping dielectric layer on a heavily-doped polycrystalline-silicon gate layer in the source region being removed by anisotropic dry etching.

4. The self-aligned planar DMOS transistor structure according to claim 1, wherein a self-aligned lightly-doped diffusion region of the second conductivity type is formed beneath a middle portion of the body diffusion region through a third self-aligned implantation window being surrounded by a second sacrificial dielectric spacer formed over a sidewall of the patterned window in the source region.

5. The self-aligned planar DMOS transistor structure according to claim 1, wherein the protection dielectric layer being made of silicon nitride is formed over the gate dielectric layer in the source region and the patterned capping dielectric layer on the patterned heavily-doped polycrystalline-silicon gate layer in the planar gate region.

6. The self-aligned planar DMOS transistor structure according to claim 1, wherein the self-aligned implantation masking layer comprises an etched-back organic polymer layer or an etched-back polycrystalline layer being formed on the protection dielectric layer surrounded by the first sacrificial dielectric spacer.

7. The self-aligned planar DMOS transistor structure according to claim 1, wherein the first sacrificial dielectric spacer being made of silicon dioxide is formed over a sidewall of the protection dielectric layer and on a side surface portion of the protection dielectric layer in the source region and is removed after performing implantation for forming the self-aligned heavily-doped contact diffusion region.

8. The self-aligned planar DMOS transistor structure according to claim 1, wherein the sidewall dielectric spacer is formed over a sidewall of the protection dielectric layer and on a side surface portion of the protection dielectric layer in the source region.

9. The self-aligned planar DMOS transistor structure according to claim 1, wherein the source metal layer comprises a metal silicide layer being formed on the self-aligned source contact window and a metal layer over a barrier metal layer being at least formed over the metal silicide layer.

10. The self-aligned planar DMOS transistor structure according to claim 4, wherein the second sacrificial dielectric spacer being made of silicon nitride is removed after performing implantation for forming the self-aligned lightly-doped diffusion region.

11. A self-aligned planar DMOS transistor structure, comprising:

a single crystalline-silicon substrate of a first conductivity type, wherein the single crystalline-silicon substrate comprises a lightly-doped epitaxial silicon layer being formed on a heavily-doped silicon substrate;

a source region being formed in the lightly-doped epitaxial silicon layer surrounded by a planar gate region, wherein the source region comprises a body diffusion region of a second conductivity type being formed in the lightly-doped epitaxial silicon layer through a patterned window for forming the source region, a self-aligned heavily-doped contact diffusion region of the second conductivity type being formed within the body diffusion region through a first self-aligned implantation window surrounded by a first sacrificial dielectric spacer, a self-aligned heavily-doped source diffusion ring of the first conductivity type being formed in a surface portion of the body diffusion region and on an extended side surface portion of the self-aligned heavily-doped contact diffusion region through a second self-aligned implantation window formed between a self-aligned implantation masking layer surrounded by the first sacrificial dielectric spacer and a protection dielectric layer being formed over a sidewall of the patterned window, and a self-aligned source contact window being formed on a surface portion of the self-aligned heavily-doped contact diffusion region surrounded by the self-aligned heavily-doped source diffusion ring and the self-aligned heavily-doped source diffusion ring surrounded by a sidewall dielectric spacer being formed over a sidewall of the protection dielectric layer and on a side portion of the protection dielectric layer;

the planar gate region being formed on the lightly-doped epitaxial silicon layer, wherein the planar gate region comprises a patterned heavily-doped polycrystalline-silicon gate layer being formed on a gate dielectric layer, self-aligned metal silicide layers being formed on the patterned heavily-doped polycrystalline-silicon gate layer through gaps formed by patterned capping dielectric layers, and refilled dielectric layers being formed on the self-aligned metal silicide layers; and a source metal layer being at least formed on the self-aligned source contact window, wherein the source metal layer comprises a metal silicide layer being formed on the self-aligned source contact window and a metal layer over a barrier metal layer being at least formed on the metal silicide layer.

12. The self-aligned planar DMOS transistor structure according to claim 11, wherein the patterned window comprises the gate dielectric layer surrounded by the patterned capping dielectric layer on the patterned heavily-doped polycrystalline-silicon gate layer.

13. The self-aligned planar DMOS transistor structure according to claim 11, wherein the protection dielectric layer being made of silicon nitride is formed over the patterned window, a sidewall of the patterned capping dielectric layer on the patterned heavily-doped polycrystalline-silicon gate layer, and a top surface of the patterned capping dielectric layer.

14. The self-aligned planar DMOS transistor structure according to claim 11, wherein the self-aligned implantation masking layer comprising an etched-back photoresist, an organic polymer layer or an etched-back polycrystalline-silicon layer is removed after performing ion implantation for forming the self-aligned heavily-doped source diffusion ring.

15. The self-aligned planar DMOS transistor structure according to claim 11, wherein the first sacrificial dielectric spacer being made of silicon dioxide is removed after forming the self-aligned implantation masking layer.

16. A self-aligned planar DMOS transistor structure, comprising
   a single crystalline-silicon substrate of a first conductivity type, wherein the single crystalline-silicon substrate comprises a lightly-doped epitaxial silicon layer being formed over a heavily-doped silicon substrate;
   a source region being formed in the lightly-doped epitaxial silicon layer surrounded by a planar gate region through a patterned window, wherein the source region comprises a body diffusion region of a second conductivity type being formed in the lightly-doped epitaxial silicon layer through the patterned window, a self-aligned lightly-doped diffusion region of the second conductivity type being formed beneath a middle portion of the body diffusion region through a third self-aligned implantation window surrounded by a second sacrificial dielectric spacer being formed over a sidewall of the patterned window, a self-aligned heavily-doped contact diffusion region of the second conductivity type being formed within the body diffusion region through a first self-aligned implantation window surrounded by a first sacrificial dielectric spacer being formed over a sidewall of the protection dielectric layer and on a side surface portion of the protection dielectric layer, a self-aligned heavily-doped source diffusion ring of the first conductivity type being formed in a surface portion of the body diffusion region and on an extended side portion of the self-aligned contact diffusion region, and a self-aligned source contact window being formed on a surface portion formed by the self-aligned contact diffusion region surrounded by the self-aligned heavily-doped source diffusion ring and the self-aligned heavily-doped source diffusion ring surrounded by a sidewall dielectric spacer being formed over a sidewall of the protection dielectric layer and on a side portion of the protection dielectric layer;
   the planar gate region being formed on the lightly-doped epitaxial silicon layer outside of the source region, wherein the planar gate region comprises a patterned heavily-doped polycrystalline-silicon gate layer being formed on a gate dielectric layer, self-aligned metal silicide layers being formed on the patterned heavily-doped polycrystalline-silicon gate layer through gaps formed by patterned capping dielectric layers, and refilled dielectric layers being formed on the self-aligned metal silicide layers; and
   a source metal layer being at least formed on the self-aligned source contact window.

17. The self-aligned planar DMOS transistor structure according to claim 16, wherein the patterned window is formed by removing a capping dielectric layer on a heavily-doped polycrystalline-silicon gate layer in the source region by using a masking photoresist step.

18. The self-aligned planar DMOS transistor structure according to claim 16, wherein the first sacrificial dielectric spacer is made of silicon dioxide and the second sacrificial dielectric spacer is made of silicon nitride.

19. The self-aligned planar DMOS transistor structure according to claim 16, wherein the self-aligned implantation masking layer comprises an etched-back organic polymer layer or an etched-back polycrystalline-silicon layer.

20. The self-aligned planar DMOS transistor structure according to claim 16, wherein the protection dielectric layer being made of silicon nitride is formed on the gate dielectric layer and a sidewall of the patterned window in the source region and on a top surface of the patterned capping dielectric layer.

* * * * *